United States Patent [19]

Ogita et al.

[11] Patent Number: 4,580,128
[45] Date of Patent: Apr. 1, 1986

[54] DIGITAL SIGNAL PROCESSING DEVICE

[75] Inventors: Minoru Ogita; Norio Tomisawa, both of Hamamatsu, Japan

[73] Assignee: Nippon Gakki Seizo Kabushiki Kaisha, Hamamatsu, Japan

[21] Appl. No.: 591,607

[22] Filed: Mar. 20, 1984

[30] Foreign Application Priority Data

Mar. 23, 1983 [JP] Japan .................. 53-48377

[51] Int. Cl.$^4$ ............................................. H03M 1/66
[52] U.S. Cl. ........................ 340/347 DA; 340/347 M
[58] Field of Search ................ 340/347 DA; 364/723, 364/724

[56] References Cited

U.S. PATENT DOCUMENTS 3,906,218  9/1975  Nussbaumer ................... 364/724 X
4,446,529  5/1984  Strolle ............................ 364/723

Primary Examiner—William M. Shoop, Jr.
Assistant Examiner—Saul M. Bergmann
Attorney, Agent, or Firm—Spensley Horn Jubas & Lubitz

[57] ABSTRACT

A digital signal processing device is disclosed. At an intermediate time point between respective sample data of a digital signal input is interpolated data expressed by the formula $$d = \sum_{l=1}^{x} \frac{R_l}{2^m} (d_{n+l} + d_{n-l+1}) \times (-1)^{l-1}$$

wherein $R_l$, m and n are positive integers. The digital signal interpolated with this interpolation data d is applied to a digital-to-analog converter where it is converted to an analog signal. This interpolation serves as a low-pass filter for removing unnecessary harmonic components, with the result that a analog filter used in a posterior stage after the digital-to-analog converter requires no steep characteristics and hence can be of a remarkably simple structure and be manufactured at reduced cost.

6 Claims, 13 Drawing Figures

DIGITAL SIGNAL PROCESSING DEVICE

BACKGROUND OF THE INVENTION (a) Field of the Invention:

This invention relates to a digital signal processing device of which the whole structure is simplified by adding, before digital-to-analog conversion processing, interpolation data obtained by using the polynominal interpolation theorem at an intermediate time point between sample data.

Figure 1:
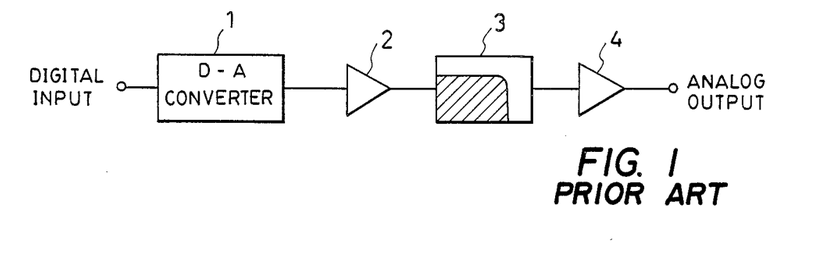
FIG. 1 is a block diagram showing an example of the structure of a conventional digital-to-analog converter.
Figure 2:
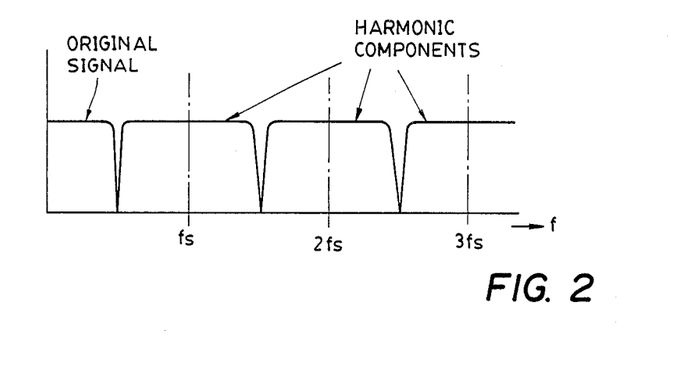
FIG. 2 is a diagram showing a signal distribution.

(b) Description of the Prior Art:

In the digital audio technique, when the original audio signal is to be obtained through demodulation of its digital signal, the digital signal is converted into analog signal by a digital-to-analog converter (D-A converter) 1 and then subjected to processings through a buffer amplifier 2, low-pass filter 3, and a buffer amplifier 4 as shown in FIG. 1. The low-pass filter 3 is provided to remove the harmonic components from the output signal of the D-A converter 1. As shown in FIG. 2, these harmonic components are formed as frequency components of the original signal are generated on both sides of frequencies which are integer multiples of the sampling frequency $f_s$. Since these harmonic components comprise frequency components located near the upper limit of the band of the original signal, the low-pass filter 3 is required to have steep cutoff characteristics. For example, in the case of compact discs where the band of the original signal is set at a range of 0–20 kHz (the sampling frequency being 44.1 kHz), such steep cutoff characteristics as to attain an attenuation rate of ±1 dB at 0–20 kHz and −90 dB at 24 kHz and over is required. Therefore, a Chebychev-type low-pass filter, which possesses such steep cutoff characteristics, is generally used. However, improvement in the cutoff characteristics of the low-pass filter results in such disadvantages as expensive production cost due to necessity for providing a filter of a higher order, deterioration of sound quality due to an increased number of elements, and substantial waveform distortion caused by considerable phase change near the upper limit of the passband.

Figure 3:
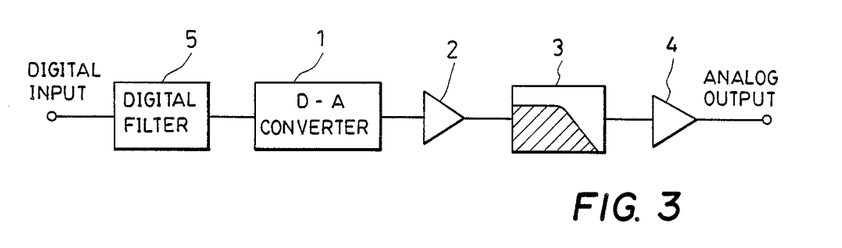
FIG. 3 is a block diagram showing the structure of the digital-to-analog conversion circuit to which the present invention is applied.

Thus attempts have been made to simplify the structure of the low-pass filter 3 by providing a digital filter 5 as shown in FIG. 3 to cut off the harmonic components generated near the upper limit of the band of the original signal before effecting digital-to-analog conversion, thereby to lessen the burden of the low-pass filter 3 disposed in the posterior stage.

However, the conventional digital filter has a long data bit length and requires a high-speed multiplier and adder as well as a RAM and ROM, resulting in complexity of the hardware structure and hence high production cost.

SUMMARY OF THE INVENTION

An object of the present invention is to provide a digital signal processing device comprising a digital filter before the digital-to-analog converter as shown in FIG. 3, in which the digital filter is of a markedly simple structure and hence much less costly to manufacture.

For achieving this object of the invention, the device is characterized by comprising means for interpolating interpolation data obtained by using the polynomial interpolation theorem at an intermediate time point between respective sample data of the digital signal and causing this means to perform the function of the digital filter.

BRIEF DESCRIPTION OF THE DRAWINGS

In the accompanying drawings.

DESCRIPTION OF THE PREFERRED EMBODIMENT

Figure 4:
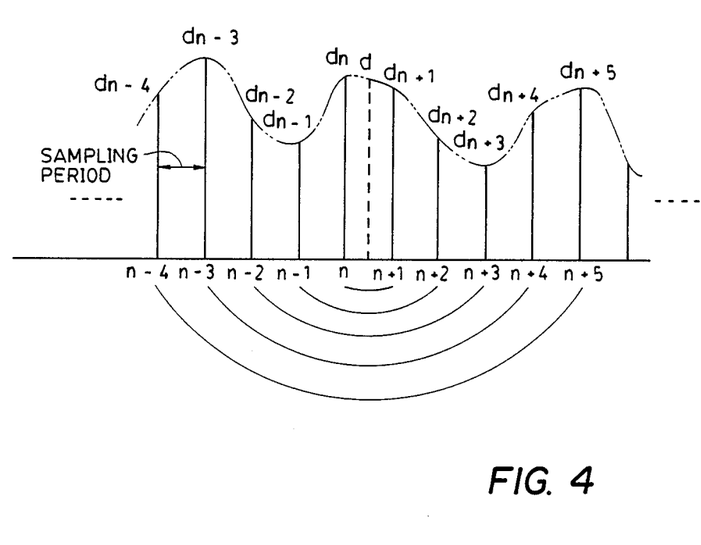
FIG. 4 is a diagram for explaining the polynomial interpolation theorem.

Where interpolation is to be effected at the intermediate time point between one sample $d_n$ and the next sample $d_{n+1}$ in the sample train as shown in FIG. 4 on the basis of couples of the preceding and succeeding samples, the interpolation value d may in general be expressed in the following polynomial.

$$d = k_1(d_{n+1}+d_n) - k_2(d_{n+2}+d_{n-1}) + k_3(d_{n+3}+d_{n-2}) + \ldots + (-1)^{l-1}k_l(d_{n+l}+d_{n-l+1}) + \ldots$$

wherein n is a positive integer.

This interpolation acts as a low-pass filter when, in terms of frequency, the signal frequency from which data d is obtained exceeds a half of the sampling frequency. Accordingly, in the case of compact discs, for example, the obtained transmission characteristics will have a cutoff frequency of 22.05 kHz i.e. a half of the sampling frequency 44.1 kHz. Therefore, a circuit capable of effecting such interpolation may be used as the digital filter 5 shown in FIG. 3.

While it is ideal that the order of the above polynomial be infinite in order to obtain optimum filter characteristics, the order is preferably as small as possible when the actual hardware structure is taken into account. It is known that at least the 5th order enables practical filter effects to be obtained. While the coefficients $k_1, k_2, k_3, \ldots$ may be so determined by calculation as to obtain the optimum filter characteristics (i.e., flatness in the passband and attenuation characteristics), the hardware structure will be simplified, design using IC will be made easy and the production cost will be reduced with the following coefficients:

$$k_1 = R_1/2^m,\ k_2 = R_2/2^m,\ k_3 = R_3/2^m, \ldots$$

wherein m and $R_1, R_2, R_3, \ldots$ are positive integers. The greater the value m, the more minutely the filter characteristics can be determined. Practically, however, a resolution obtained more or less with m=8 (i.e., $2^m = 256$) is sufficient in most cases.

An embodiment of the invention will now be described referring to the attached drawings. In this embodiment, the polynomial shall be of the 5th order, m=8, the coefficients $k_1$ to $k_5$ shall be:

$k_1 = 156/256$
$k_2 = 40/256$
$k_3 = 16/256$
$k_4 = 7/256$
$k_5 = 3/256$ and the operation:

$$d = \frac{156}{256}(d_{n+1} + d_n) - \frac{40}{256}(d_{n+2} + d_{n-1}) + \quad (1)$$

$$\frac{16}{256}(d_{n+3} + d_{n-2}) - \frac{7}{256}(d_{n+4} + d_{n-3}) +$$

$$\frac{3}{256}(d_{n+5} + d_{n-4})$$

will be performed by way of example.

Figure 5:
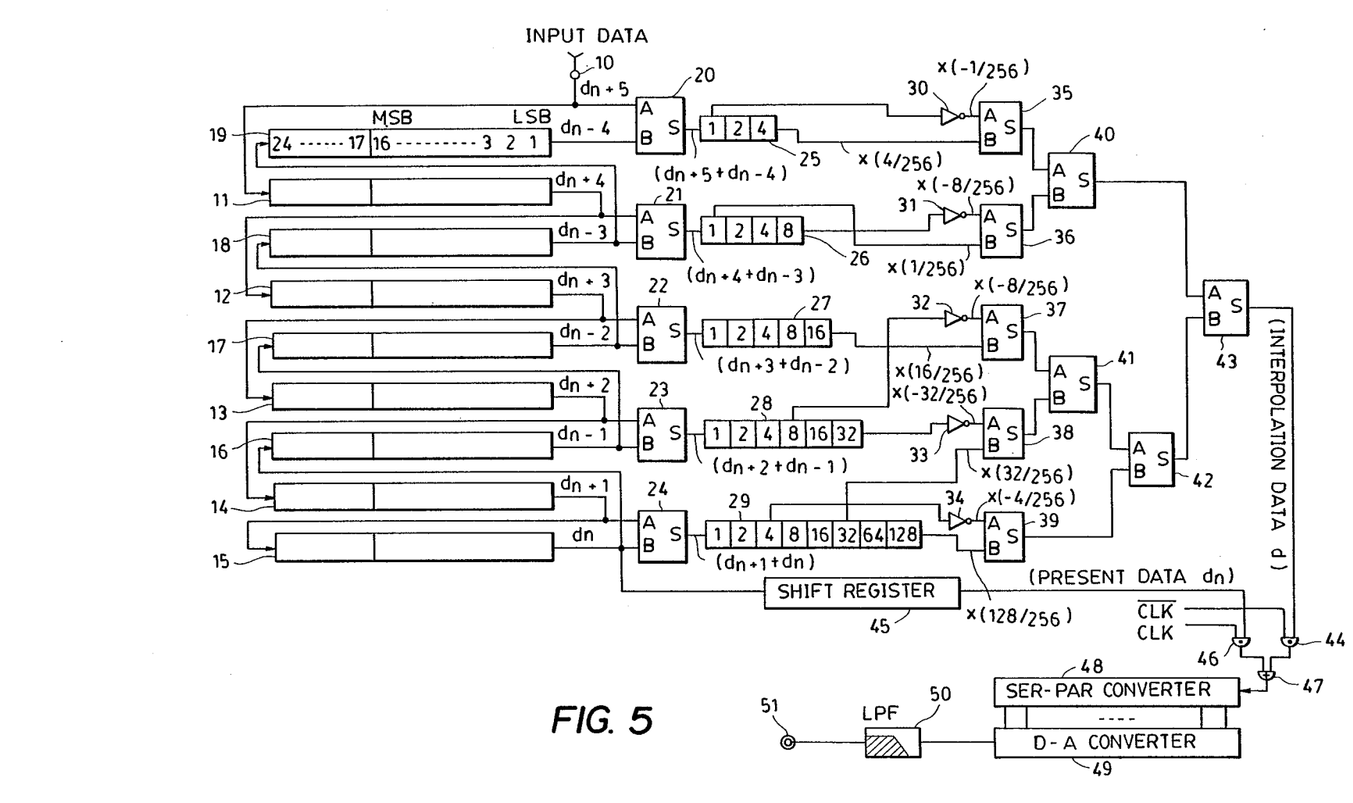
FIG. 5 is a block diagram showing an embodiment of the invention.

Referring to FIG. 5, the serial data supplied through an input terminal 10 consists of 24 bits, i.e., 16 bits for data bits and 8 bits for extension bits which are added before the data bits to affix the coefficient $1/2^m$. The 24-bit data are successively supplied in reverse order (the least significant bit first) and delivered to shift registers 11, 12, 13, . . . , 18 and 19 in order (the clock supply route is not shown). The shift registers 11 to 19 respectively consist of 24 bits, i.e., 16 bits for data bits and 8 bits for extension bits in conformity with the input data. These 8 extension bits are used as a bit-shift register to affix the coefficient. Since the coefficient is halved by every 1-bit shift, an 8-bit shift as effected in this example results in affixing a coefficient $1/2^8 = 1/256$.

The shift registers 11 to 19 are provided to delay the input data and obtain samples at the respective time points. The data held in the shift register 15 is the present data $d_n$, the data held in the succeeding shift registers 16, 17, 18, 19 are data $d_{n-1}$, $d_{n-2}$, $d_{n-3}$, $d_{n-4}$ and the data held in the preceding shift registers 14, 13, 12, 11 are data $d_{n+1}$, $d_{n+2}$, $d_{n+3}$, $d_{n+4}$. The data supplied through the input terminal 10 is data $d_{n+5}$.

The data held in the shift registers 11 to 19 respectively are produced according to given clocks in order, the least significant bit first. As mentioned above, the data has 8 extension bits before the data bits. Therefore, the coefficient part 1/256 of the coefficients $k_1$ to $k_5$ is already provided.

Data $d_{n+5}$ supplied through the input terminal 10 and data $d_{n+4}$ are successively added by a serial full-adder 20 (details such as carry operation are not shown) which generates $d_{n+5}+d_{n-4}$. A full-adder 21 likewise adds the outputs of the shift registers 11, 18 and generates $d_{n+4}+d_{n-3}$. A full-adder 22 adds the outputs of the shift registers 12, 17 and generates $d_{n+3}+d_{n-2}$. A full-adder 23 adds the outputs of the shift registers 13, 16 and generates $d_{n+2}+d_{n-1}$. A full-adder 24 adds the outputs of the shift registers 14, 15 and generates $d_{n+1}+d_n$.

The outputs of the serial full-adders 20 to 24 are applied to shift registers 25 to 29, respectively. These shift registers 25 to 29 are provided to impart the coefficients corresponding to the numerators of the respective coefficients $k_1$ to $k_5$. More specifically, since from the 1st stages of the shift registers 25 to 29 are obtained the input data as such, the input data affixed with a coefficient 1 are obtained therefrom respectively. Since from the 2nd stages are obtained the input data as shifted by one bit (i.e., carried by one stage), the input data affixed with a coefficient 2 are obtained therefrom. Likewise, from the 3rd, 4th, . . . , 8th stages are obtained input data affixed with coefficients 4, 8, 16, 32, 64, 128, respectively. Therefore, the respective numerators 156, 40, 16, 7, 3 of the coefficients $k_1$ to $k_5$ and the positive and negative signs of the respective order-wise terms can be obtained by appropriate addition and subtraction operations of these data.

The signal of the shift register 25 is produced from its 1st (coefficient 1) and 3rd (coefficient 4) stages. Its 1st stage output is complemented by an inverter 30 (the carry generated by the addition in the complement system is placed in the 17th bit outside the data bits so in fact disregarded) and applied to a full-adder 35. The output of the 3rd stage is applied as such to the full-adder 35. The full-adder 35 generates $3/256(d_{n+5}+d_{n-4})$. Similarly, a full-adder 36 receives the 1st-stage output (coefficient 1) as such of the register 26 and its 4th-stage output (coefficient 8) as complemented by an inverter 31 and adds these inputs to generate $-7/256(d_{n+4}+d_{n-3})$. A full-adder 37 receives the 5th-stage output (coefficient 16) as such of the shift register 27 and the 4th-stage output (coefficient 8) of the shift register 28 as complemented by an inverter 32 and adds these inputs to generate $16/256(d_{n+3}+d_{n-2})-8/256(d_{n+2}+d_{n-1})$. A full-adder 38 receives the 6th-stage output (coefficient 32) of the shift register 28 as complemented by an inverter 33 and the 6th-stage output (coefficient 32) of the shift register 29 as such and adds these inputs to generate $32/256(d_{n+1}+d_n)-32/256(d_{n+2}+d_{n-1})$. A full-adder 39 receives the 3rd-stage output (coefficient 4) of the shift register 29 as complemented by an inverter 34 and its 8th-stage output (coefficient 128) as such and adds these inputs to generate $124/256(d_{n+1}+d_n)$.

The outputs of the full-adders 35, 36 are added by a full-adder 40 and the outputs of the full-adders 37, 38 are added by a full-adder 41. Further the outputs of the full-adders 41, 39 are added by a full-adder 42 and the outputs of the full-adders 40, 42 are added by a full-adder 43. Consequently, the full-adder 43 generates the interpolation data d represented by the expression (1) previously given.

The interpolation data d is applied to an AND gate 44 while the present data $d_n$ is applied to an AND gate 46 through a shift register 45 provided to synchronize the timing.

These data are alternately read from the respective AND gates 44, 46 according to clocks $\overline{CLK}$, CLK (this alternate reading is carried out at twice the sampling frequency). An OR gate 47 generates data wherein the interpolation data is added at the intermediate time point between the individual input data. The data from the OR gate 47 is converted into parallel data by a serial-to-parallel converter 48, converted into an analog signal by a digital-to-analog converter 49 and, through a low-pass filter 50, produced from an output terminal 51.

Figure 6:
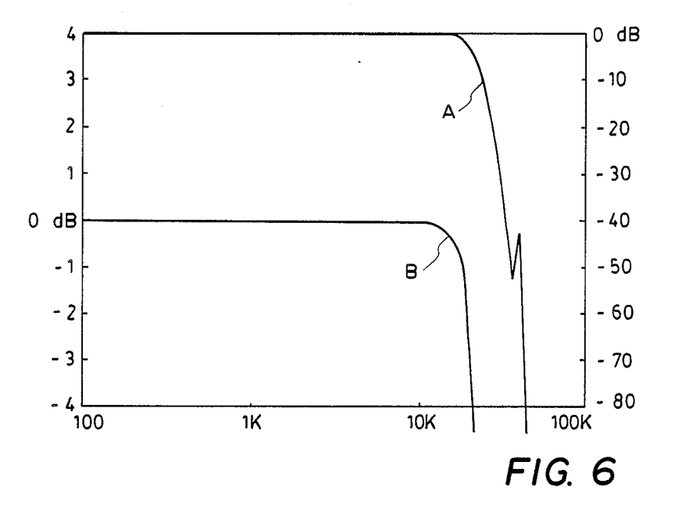
FIG. 6 is a graph showing the filter characteristics obtained by the circuit shown in FIG. 5.

FIG. 6 shows the filter characteristics obtained by the structure illustrated in FIG. 5 (characteristics obtained using the circuit from the input terminal 10 to the OR gate 47). In FIG. 6, a curve A is plotted against the scale on the right and a curve B against the enlarged scale on the left. According to this graph, the attenuation rate in the frequency range of 0–20 kHz is held within −3 dB (−2.71 dB at 20 kHz), evidencing the adequate practical utility of the filter characteristics obtained.

FIGS. 7 to 13 illustrate a variety of filter characteristics obtained by varying the order of the polynomial and the like (as in FIG. 6, a curve B is enlarged with regard to a curve A in each of these graphs). These graphs result from the respective orders and coefficients as set out below.

Figure 7:
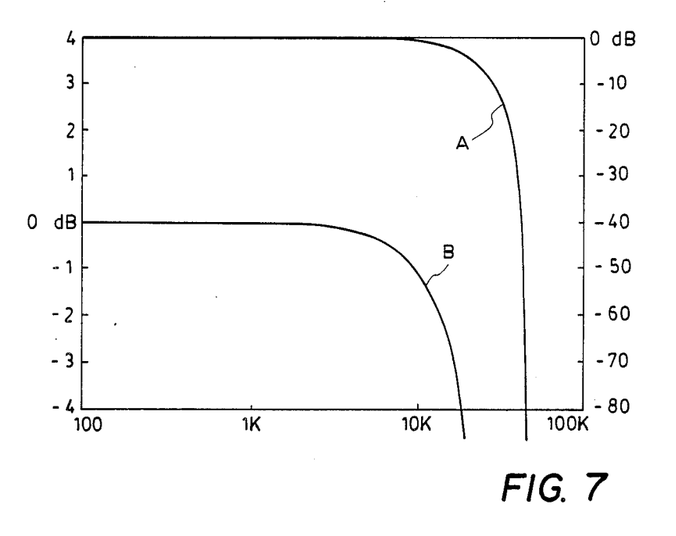
FIGS. 7 to 13 are graphs showing a variety of filter characteristics obtained by varying the order and coefficients of the polynomial used with the structure shown in FIG. 5.
Figure 8:
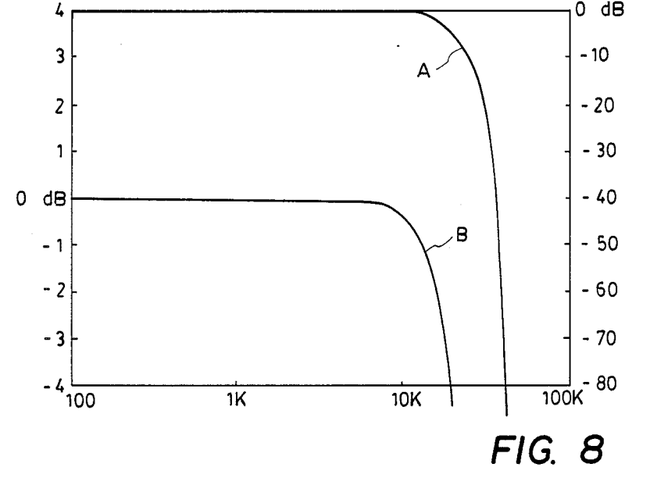
Figure 9:
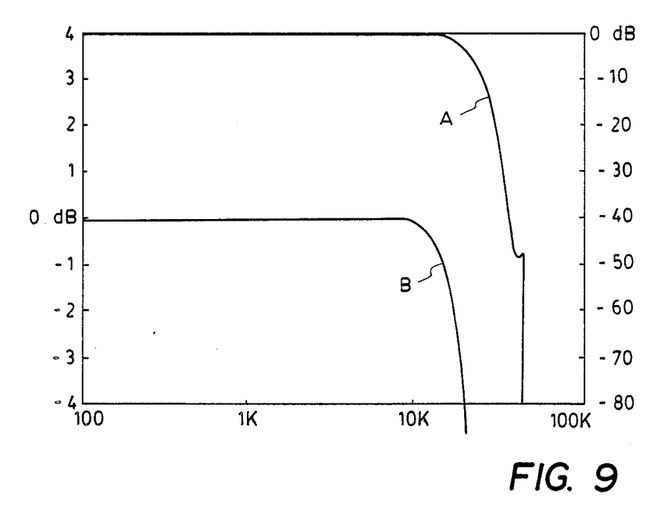
Figure 10:
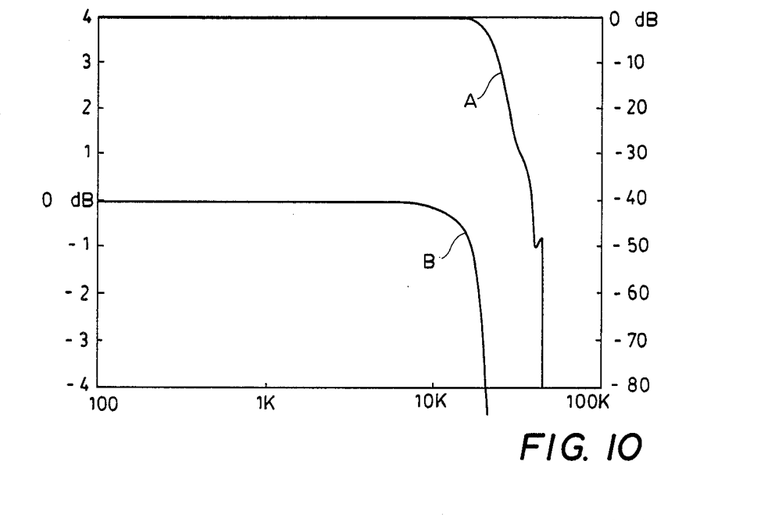
Figure 11:
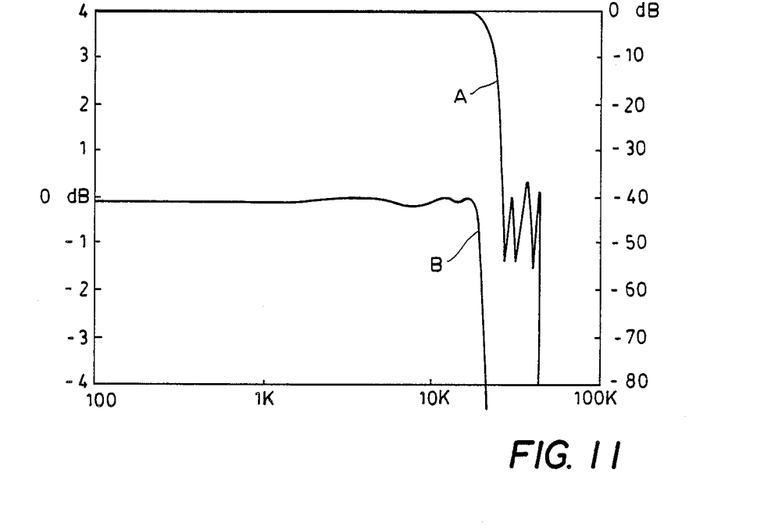
Figure 12:
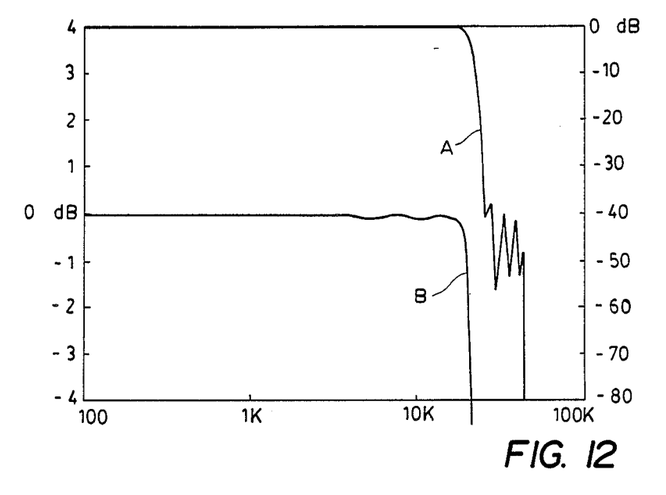
Figure 13:
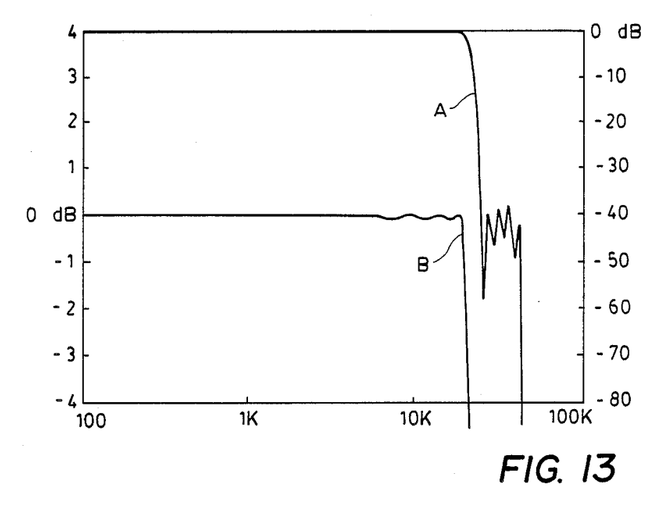

| FIG. | ORDER | NUMERATORS OF COEFFICIENTS (DENOMINATOR IS 256) | ATTENUATION RATE (dB) AT 20 kHz |
|---|---|---|---|
| FIG. 7 | 1st | $R_1 = 128$ | −4.84 |
| FIG. 8 | 2nd | $R_1 = 144, R_2 = 16$ | −4.30 |
| FIG. 9 | 3rd | $R_1 = 149, R_2 = 25$ $R_3 = 3$ | −3.95 |
| FIG. 10 | 4th | $R_1 = 152, R_2 = 33$ $R_3 = 11, R_4 = 3$ | −3.53 |
| FIG. 11 | 6th | $R_1 = 159, R_2 = 49$ $R_3 = 25, R_4 = 13$ $R_5 = 7, R_6 = 4$ | −1.76 |
| FIG. 12 | 8th | $R_1 = 160, R_2 = 50$ $R_3 = 27, R_4 = 16$ $R_5 = 10, R_6 = 6$ $R_7 = 4, R_8 = 2$ | −1.11 |
| FIG. 13 | 9th | $R_1 = 160, R_2 = 51$ $R_3 = 29, R_4 = 18$ $R_5 = 12, R_6 = 8$ $R_7 = 5, R_8 = 3$ $R_9 = 2$ | −0.72 |

As described above, it is possible according to the invention to make interpolation data using only shift registers and full-adders and thus dispense with multipliers, RAMs, ROMs and the like required in the conventional digital filters. The device according to the invention therefore has a simple structure and hence may be manufactured at reduced cost.

What is claimed is:

1. A digital signal processing device comprising:
a digital signal input terminal to which a digital signal to be converted into an analog signal is applied;
interpolating means for interpolating interpolation data expressed by the formula $$d = \sum_{l=1}^{x} \frac{R_l}{2^m} (d_{n+l} + d_{n-l+1}) \times (-1)^{l-1}$$

wherein R, m and n are positive integers, at an intermediate time point between respective sample data of said digital signal; and
a digital-to-analog converter converting the digital signal provided with the interpolation data by said interpolating means into an analog signal.

2. A digital signal processing device as defined in claim 1 wherein said interpolation means comprises:
means for obtaining data of plural sample points preceding and succeeding the present data;
adder means for obtaining $(d_{n+l} + d_{n-l+1})$ by adding the data of the plural sample points;
coefficient imparting means for imparting $R_l/2^m$ to $(d_{n+l} + d_{n-l+1})$;
adder means for adding respective $(d_{n+l} + d_{n-l+1})$ imparted with the respective coefficients together to derive interpolation data; and
means for obtaining the present data and the interpolation data alternately at a frequency which is twice the sampling frequency of the present data to supply the alternate data to said digital-to-analog converter.

3. A digital signal processing device as defined in claim 2 wherein said means for obtaining data of plural sample points preceding and succeeding the present data are multi-stage shift registers.

4. A digital signal processing device as defined in claim 2 wherein said coefficient imparting means are shift registers which impart coefficients by differing timing of reading of passing data.

5. In a system in which signals are represented digitally by sample point values at a certain sampling frequency, the improvement comprising:
digital filter means for digitally filtering said signals by implementing the polynomial interpolation equation $$d = \sum_{l=1}^{x} \frac{R_l}{2^m} (d_{n+l} + d_{n-l+1}) \times (-1)^{l-1}$$

whereby the resultant digital signal has effectively reduced high frequency components above one half said sampling frequency.

6. In a system for reproducing an audio signal represented digitally by successive digital sample point values at a given sampling rate, the improvement comprising:
interpolation means for interpolating said digital signal at intermediate time points between said sample points utilizing the polynomial interpolation theorem, whereby the high frequency components of said interpolated digital signal above one half said sampling rate are attenuated,
digital-to-analog converting means for converting said interpolated digital signal into an analog signal, and
low pass filter means having more gradual cutoff characteristics than would otherwise be required if said interpolation means were not used.

* * * * *